United States Patent
Lee

(10) Patent No.: US 11,088,606 B2
(45) Date of Patent: Aug. 10, 2021

(54) LINEAR VIBRATION GENERATING DEVICE

(71) Applicant: MPLUS CO., LTD., Suwon-si (KR)

(72) Inventor: Tae Hoon Lee, Suwon-si (KR)

(73) Assignee: MPLUS CO., LTD., Suwon-si (KR)

( * ) Notice: Subject to any disclaimer, the term of this patent is extended or adjusted under 35 U.S.C. 154(b) by 610 days.

(21) Appl. No.: 16/010,887

(22) Filed: Jun. 18, 2018

(65) Prior Publication Data

US 2019/0006927 A1    Jan. 3, 2019

(30) Foreign Application Priority Data

Jun. 30, 2017    (KR) .................. 10-2017-0083473

(51) Int. Cl.
| | |
|---|---|
| *H02K 33/18* | (2006.01) |
| *H02K 33/02* | (2006.01) |
| *G06F 3/01* | (2006.01) |
| *H02P 3/18* | (2006.01) |
| *H02P 3/22* | (2006.01) |
| *H02P 3/12* | (2006.01) |
| *H02P 3/08* | (2006.01) |

(Continued)

(52) U.S. Cl.
CPC ............ *H02K 33/18* (2013.01); *G06F 3/016* (2013.01); *H02K 33/02* (2013.01); *H02P 3/06* (2013.01); *H02P 3/08* (2013.01); *H02P 3/12* (2013.01); *H02P 3/18* (2013.01); *H02P 3/22* (2013.01); *H02K 33/16* (2013.01); *H02P 25/032* (2016.02); *H02P 25/034* (2016.02); *H03K 17/687* (2013.01)

(58) Field of Classification Search
CPC ........................ H02K 33/18; H03K 17/687

USPC .................. 318/380, 379, 375, 362
See application file for complete search history.

(56) References Cited

U.S. PATENT DOCUMENTS

| | | | |
|---|---|---|---|
| 3,919,611 A | 11/1975 | Takahashi et al. | |
| 4,184,757 A | 1/1980 | Kondo | |

(Continued)

FOREIGN PATENT DOCUMENTS

| | | |
|---|---|---|
| CN | 1452303 A | 10/2003 |
| CN | 102158169 A | 8/2011 |

(Continued)

OTHER PUBLICATIONS

SIPO Office Action dated Dec. 4, 2019 in connection with Chinese Patent Application No. 201810706444.5 which corresponds to the above referenced U.S. application.

(Continued)

*Primary Examiner* — David Luo
(74) *Attorney, Agent, or Firm* — LRK Patent Law Firm

(57) ABSTRACT

A linear vibration generating device installed inside a cellular phone, a vibration bell or the like to generate vibration. Right after the power applied to the 'circuit (a circuit generating and controlling vibration)', which is one of elements constituting the linear vibration generating device, is turned off, the 'circuit' is configured as a short circuit. In addition, the linear vibration generating device can be easily manufactured since an additional space inside the linear vibration generating device is not required, and there is an outstanding effect of promptly removing residual vibration by increasing the amount of vibration damping after the vibration operation of the vibration generating device including a permanent magnet is finished.

14 Claims, 5 Drawing Sheets

(a)

(b)

(c)

(51) Int. Cl.
*H02P 3/06* (2006.01)
*H03K 17/687* (2006.01)
*H02K 33/16* (2006.01)
*H02P 25/034* (2016.01)
*H02P 25/032* (2016.01)

(56) References Cited

U.S. PATENT DOCUMENTS

| | | | | |
|---|---|---|---|---|
| 4,757,246 A * | 7/1988 | Komuro | ............... | H02P 8/14 |
| | | | | 318/567 |
| 7,816,873 B2 * | 10/2010 | Choi | ............... | F04B 35/045 |
| | | | | 318/119 |
| 8,143,817 B2 * | 3/2012 | Izumi | ............... | H02K 33/14 |
| | | | | 318/114 |
| 9,525,379 B2 * | 12/2016 | Umehara | ............ | H02P 25/032 |

FOREIGN PATENT DOCUMENTS

| | | |
|---|---|---|
| CN | 102197571 A | 9/2011 |
| CN | 102301415 A | 12/2011 |
| CN | 102832778 A | 12/2012 |
| CN | 103635867 A | 3/2014 |
| CN | 105027418 A | 11/2015 |
| JP | S60182567 A | 9/1985 |
| JP | H05211798 A | 8/1993 |
| JP | 2001215253 A | 8/2001 |
| JP | 2005149537 A | 6/2005 |
| KR | 1020080002888 A | 1/2008 |
| KR | 10-2011-0126278 A | 11/2011 |
| KR | 1020110125608 A | 11/2011 |
| KR | 10-1151396 B1 | 6/2012 |
| KR | 10-1203363 B1 | 11/2012 |
| KR | 101212837 B1 | 12/2012 |

OTHER PUBLICATIONS

KIPO Notice of Allowance dated Apr. 12, 2019 in connection with Korean Patent Application No. 10-2017-0083473 which corresponds to the above referenced U.S. application.

KIPO Office Action dated Aug. 29, 2018 in connection with Korean Patent Application No. 10-2017-0083473 which corresponds to the above referenced U.S. application.

* cited by examiner (a)

(b)

(c)

LINEAR VIBRATION GENERATING DEVICE

CROSS-REFERENCE TO RELATED APPLICATION

This application claims priority to Korean Patent Application No. 10-2017-0083473, filed Jun. 30, 2017, the entire content of which is incorporated herein by reference.

BACKGROUND OF THE INVENTION

1. Field of the Invention

The present invention relates to a linear vibration generating device, and more specifically, to a linear vibration generating device installed inside a cellular phone, a vibration bell or the like to generate vibration.

2. Background of Related Art

As a device including a vibration generating device therein (hereinafter, referred to as a vibration device) is generally used today, development and distribution of a vibration device provided with various haptic functions are actively promoted.

The vibration device should be a portable size and capable of generating a vibration force sufficient for a user to recognize vibration generated by the vibration device.

In addition, correct ON/OFF control on the vibration of the vibration device should be performed, and particularly, a user needs to instantly recognize turning off of vibration by promptly removing residual vibration when the vibration is turned off.

Conventionally, although a method of synchronizing an actuator with a signal or a touch on a screen inputted by a user is used to implement vibration of a vibration device through the actuator, if such a method is adopted, there is a problem of generating damped vibration (residual vibration) even after the signal or the touch inputted by the user is finished, due to the energy and inertia stored in a spring constituting the actuator.

A buffering method using a material having a damping coefficient such as a magnetic fluid or a sponge or a buffering method using an attractive force between a magnetic substance and a permanent magnet is used to solve the problem. However, the buffering method using a material having a damping coefficient shows a vibration damping effect only when the material having a damping coefficient directly contacts with a vibrator, and the buffering method using an attractive force between a magnetic substance and a permanent magnet is relatively less effective (low force) and has a problem of adversely affecting the rising time, which is a factor related to a response time.

Therefore, a vibration generating device capable of generating vibration in various frequency bands and having an excellent response time is required to implement more realistic haptic functions.

SUMMARY OF THE INVENTION

Accordingly, the present invention has been made in view of the above-mentioned problems occurring in the prior art, and it is an object of the present invention to provide a linear vibration generating device which can promptly remove residual vibration by increasing the amount of vibration damping after the vibration operation of the vibration generating device including a permanent magnet is finished, by providing a system which configures a circuit constituting the linear vibration generating device as a short circuit right after the power applied to the circuit is turned off.

In addition, another object of the present invention is to provide a linear vibration generating device which can promptly remove residual vibration by increasing the amount of vibration damping after the vibration operation of the vibration generating device through configuration of a short circuit, without making an additional change in an inner space of the linear vibration generating device or separately providing a device for securing a space.

Meanwhile, the technical problems to be solved by the proposed invention are not limited to those mentioned above, and various technical problems may be further included from the following descriptions within a scope apparent to those skilled in the art.

To accomplish the above objects, there is provided a linear vibration generating device comprising: a bracket 10 to which a coil 11 is fixed; a case 20 combined with the bracket 10; a vibrator 30 including a permanent magnet 31 of a ring shape and installed inside the case; and an elastic body combined with the vibrator 30, wherein a response time is improved by using counter electromotive voltage that is generated after supply of power to a circuit connected to the coil 11 is interrupted.

A short circuit is configured after the power is turned off in order to use the counter electromotive voltage that is generated in a free run state after supply of power to the circuit connected to the coil is interrupted.

The circuit connected to the coil may include at least one configuration among a reed switching system, a power switching device, a MOSFET, and an H-bridge including a transistor pair in order to configure the short circuit after power of the circuit connected to the coil is turned off.

Whether there is a delay time before the short circuit is configured after power of the circuit connected to the coil 11 is turned off may be set.

In addition, the delay time may vary according to setting of the user.

In addition to the configuration as described above, the present invention may propose a solution from the methodological aspect.

A linear vibration control method according to an embodiment of the present invention may include: a power applying step of applying power to a circuit including a coil 11 by an external stimulus; a driving step of generating vibration as current flowing in the coil 11 by the power applying step reacts with a permanent magnet 31; a power shutdown step of shutting down the power as the external stimulus to the circuit including the coil 11 is stopped; and a short circuit configuration step of configuring a short circuit which short-circuits the circuit including the coil 11, of which the power is shut down by the power shutdown step.

In addition, the linear vibration control method may further include an open circuit maintaining step of maintaining an open circuit state of the circuit including the coil after control on linear vibration is finished by the short circuit configuration step.

the short circuit configuration step may include at least any one among a first control step of configuring the short circuit through a reed switching system, a second step of configuring the short circuit through configuration of a brake circuit including an H-bridge, and a third step of configuring the short circuit through configuration of a circuit including a MOSFET.

The linear vibration control method may further include a delay step between the driving step and the short circuit configuration step.

DETAILED DESCRIPTION OF THE PREFERRED EMBODIMENTS

Hereinafter, some embodiments of the present invention will be described in detail through exemplar drawings. Constitutional elements of each embodiment can be diversely combined within the embodiments unless mentioned otherwise or contradictory to each other. Furthermore, the proposed invention may be implemented in various different forms and is not limited to the embodiments described herein.

It should be noted that in assigning reference symbols to constitutional elements of each figure, like symbols will be used for the same constitutional elements wherever possible although they are shown in different figures. In addition, in describing the embodiments of the present invention, if it is determined that detailed descriptions on already known configurations or functions related to the present invention may hinder the understanding the embodiments of the present invention, detailed descriptions thereof will be omitted.

In addition, if a certain element "includes" a certain constitutional element, this means further including another constitutional element, not excluding another constitutional element, as far as an opposed description is not specially specified.

In addition, in describing the constitutional elements of the embodiments of the present invention, terms such as first, second, A, B, (a), (b), etc. may be used. These terms are only to distinguish one constitutional element from the other constitutional elements, and the essentials, orders or sequences of corresponding constitutional elements are not limited by the terms. Throughout the specification, when an element is "connected" to another element, it includes a case of "electrically connecting" the elements with intervention of another element therebetween, as well as a case of "directly connecting" the elements.

Figure 1:
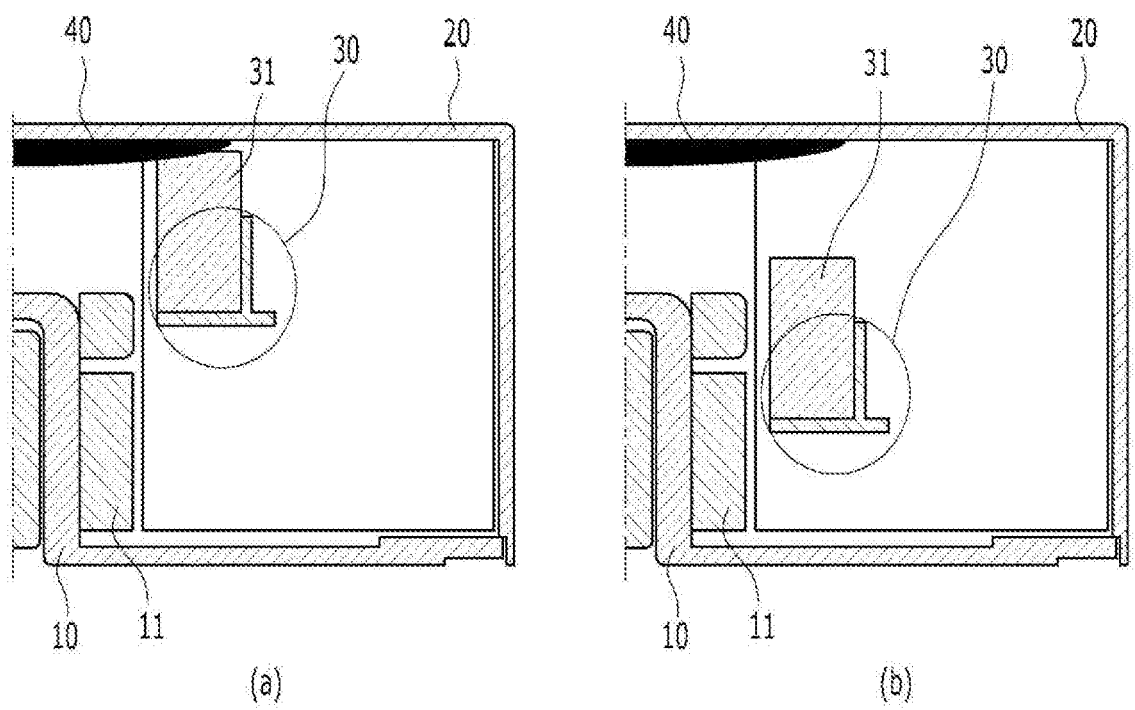
FIG. 1 is a cross-sectional view of a linear vibration generating device showing embodiment (a) of the present invention and embodiment (b) of a conventional technique.

FIG. 1 is a cross-sectional view of a linear vibration generating device showing embodiment (a) of the present invention and embodiment (b) of a conventional technique.

FIG. 1(b) is a cross-sectional view showing a linear vibration generating device using a conventional technique.

Although it has been tried in the conventional technique to solve the problem of residual vibration remaining even after a touch by using a buffering method using a material having a damping coefficient such as a magnetic fluid or a sponge or a buffering method using an attractive force between a magnetic substance and a permanent magnet, the buffering method using a material having a damping coefficient shows a vibration damping effect only when the material having a damping coefficient directly contacts with a vibrator, and the buffering method using an attractive force between a magnetic substance and a permanent magnet is relatively less effective (low force) and has a problem of adversely affecting the rising time, which is a factor related to a response time.

Therefore, the present invention provides a linear vibration generating device which can accurately and perfectly control residual vibration by reducing falling time by configuring a short circuit when the power applied to a circuit which generates vibration of a vibration generating device is turned off, without requesting a separate installation space inside the linear vibration generating device.

Specifically, the falling time is reduced by configuring a circuit constituting the linear vibration generating device as a closed circuit (a short-circuited state) using a physical, circuit-based or control-based technique after applying a power signal or a reverse direction pulse, and forcibly applying a force in a direction opposite to a moving direction using short circuit current which flows by the counter electromotive voltage generated by a moving electromagnetic force when the short circuit is in a free run state (a state of operating without applying power).

In addition, since the circuit of the linear vibration generating device is not configured as a short circuit at the time point of applying power, unlike a conventional technique, only the falling time can be reduced without affecting the rising time.

Referring to FIG. 1(a), a linear vibration generating device according to an embodiment of the present invention may include a bracket 10 to which a coil 11 is fixed, a case 20 combined with the bracket 10, a vibrator 30 including a permanent magnet 31 of a ring shape and installed inside the case 20, and an elastic body connected to the vibrator 30 to transfer vibration.

The bracket 10 and the case 20 form the outer part of the linear vibration generating device, and the stator (including the coil), the vibrator (including the permanent magnet) and the elastic body (not shown) may be installed inside the linear vibration generating device and generate vibration.

In this case, in configuring a circuit connected to the coil 11, an element for controlling power applied to the circuit may be included.

A linear vibration generating device according to another embodiment of the present invention may include a bracket 10 to which a coil 11 is fixed, a case 20 combined with the bracket 10 to form an inner space and including a case hole of a predetermined size, a vibrator 30 including a permanent magnet 31 of a ring shape and installed in the inner space the case 20, an elastic body connected to the vibrator 30 to transfer vibration, and a hole sensor installed at the position of a case hole of the case to face the permanent magnet.

In this case, the case 20 may further include a case top cover which covers the case hole and is installed in combination with the hole sensor.

A linear vibration generating device according to still another embodiment of the present invention may include a bracket 10 to which a coil 11 is fixed, a case 20 combined with the bracket 10 to form an inner space, a vibrator 30 including a permanent magnet 31 of a ring shape and installed in the inner space, an elastic body connected to the vibrator 30 to transfer vibration, and a hole sensor positioned in combination with the coil 11 fixed to the bracket 10.

In this case, the hole sensor may be combined and fixed on the top or bottom of the coil 11 fixed to the bracket 10 and preferably combined and fixed on the top of a coil yoke connected to the bracket 10.

A linear vibration generating device according to still another embodiment of the present invention may include a bracket 10 to which a coil 11 is fixed, a case 20 combined with the bracket 10 to form an inner space, a vibrator 30 including a permanent magnet 31 of a ring shape and installed in the inner space, an elastic body connected to the vibrator 30 to transfer vibration, and a hole sensor positioned at a bracket hole formed in the bracket 10.

Figure 2:
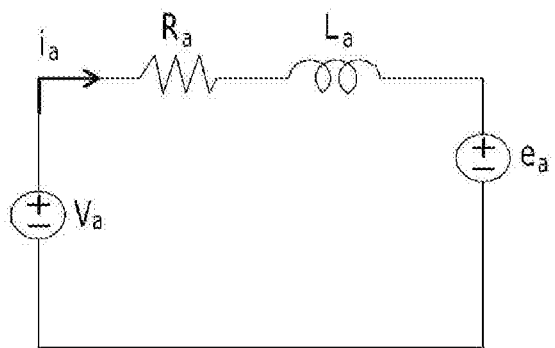
FIG. 2 is a flow of configuration of a circuit including a coil fixed inside a linear vibration generating device, showing an embodiment of the present invention.
Figure 2:
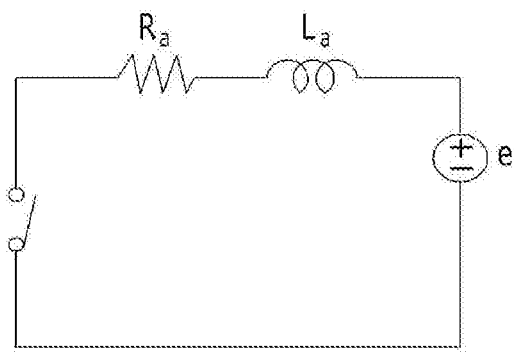
Figure 2:
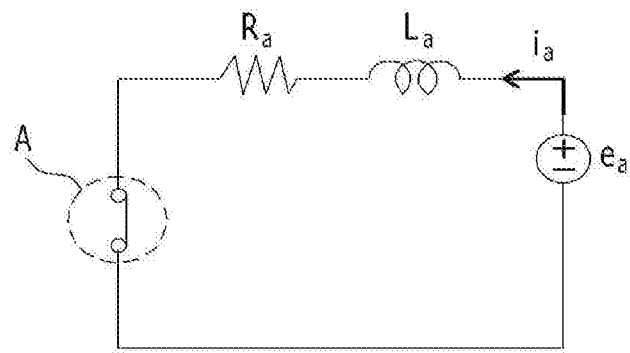

FIG. 2 is a flow of configuration of a circuit including a coil fixed inside a linear vibration generating device, showing an embodiment of the present invention;

Referring to FIG. 2, (a) a state of applying power before configuring a short circuit, (b) a state of turning off the power and (c) a circuit in which a short circuit is configured can, be confirmed.

Referring to FIG. 2(*a*), when power is applied to the circuit, the power Va can be supplied without configuring a short circuit.

Since the shots circuit is not configured while power is applied like this and the short circuit A is configured only after the power is turned off, only the falling time can be, reduced without affecting the rising time.

Referring to FIG. 2(*b*) and FIG. 2(*c*), the circuit connected to the coil 11 may configure a short circuit A using a physical, circuit-based or control-based technique in order to use the counter electromotive voltage after supply of power is interrupted.

Since the short circuit A is configured after the power is turned off, the falling time can be reduced by forcibly applying a force in a direction opposite to a moving direction sing short circuit, current which flows by the counter electromotive voltage generated by a moving electromagnetic force when the short circuit is in a free run state (a state of operating without applying power).

Magnitude of the counter electromotive voltage generated at this point is as shown below.

$$1 = L\Delta i / \Delta t$$

That is, the counter electromotive voltage is proportional to the magnitude L of the inductance of the coil and a rate of change of current with respect to time.

At this point, whether there is a time delay for configuring the short circuit after the power is turned off may be set according to setting of a user. In addition, the delay time can be controlled according to setting of the user.

Since the counter electromotive voltage is proportional to the rate of change of current with respect to time, if the short circuit is configured right after the power is turned off, an extremely large counter electromotive voltage is generated, and elements of the circuit can be damaged.

Accordingly, if change of voltage applied to the circuit is adjusted by controlling existence of time delay and the delay time for configuring the short circuit after the power is turned off, damage of the elements can be prevented.

The circuit connected to the coil 11 may include at least one among a reed switching system using a reed switch, a circuit configuration including a MOSFET, and a brake circuit configuration including an H-bridge including a transistor pair in order to configure the short circuit A after the power is turned off.

The reed switch of the reed switching system is a magnetic sensor having reed contact points in a small glass tube, which corresponds to a magnetic sensor that is short-circuited if any one of N and S poles approaches and open-circuited if the N and S poles move away from the reed switch.

While a small permanent magnet is put close to one side of the reed switch, if a different pole of the magnet is put close to the other side of the reed switch, the reed switch is short-circuited (ON), and if the same pole is put close, the reed switch is open-circuited (OFF). Apparently, if the same pole is put away, the reed switch is short-circuited.

Figure 3:
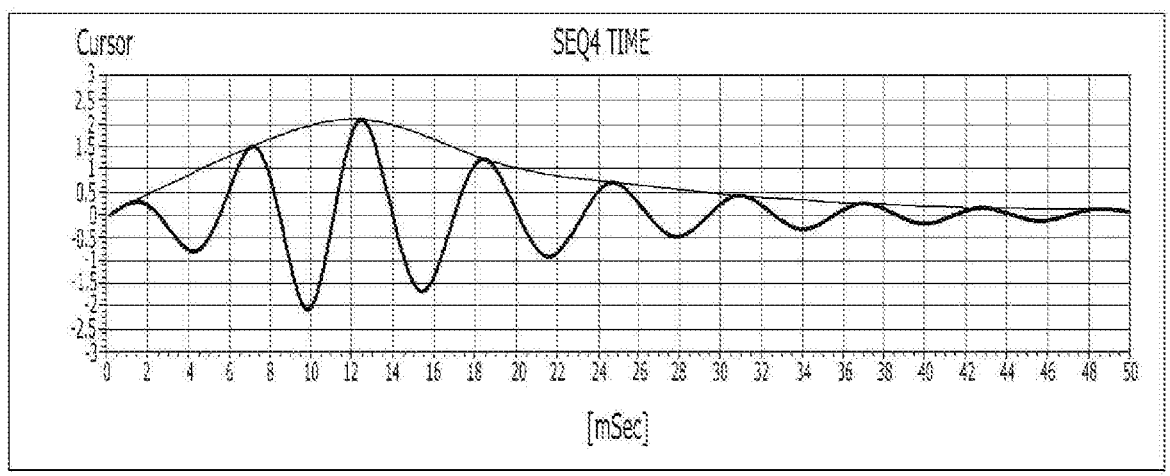
FIG. 3 is a waveform diagram showing a waveform of a vibrator according to a conventional technique.

FIG. 3 is a waveform diagram showing a waveform of a vibrator according to a conventional technique.

According to a conventional technique, since it takes a long time to reduce the vibration force to a certain level after power is shut down, there is a problem in that residual vibration remains and hinders the user's feeling of use.

Figure 4:
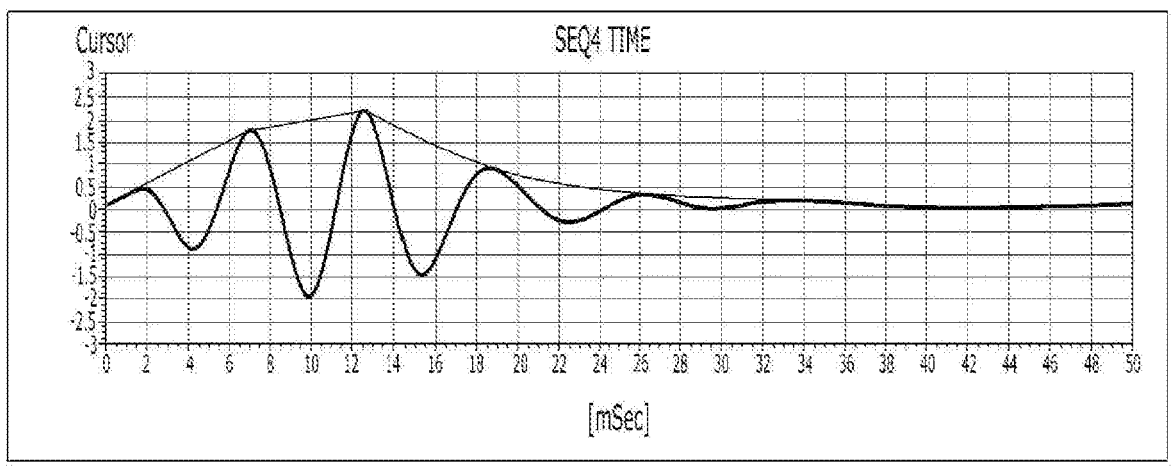
FIG. 4 is a waveform diagram showing a waveform of a vibrator according to an embodiment of the present invention.
Figure 5:
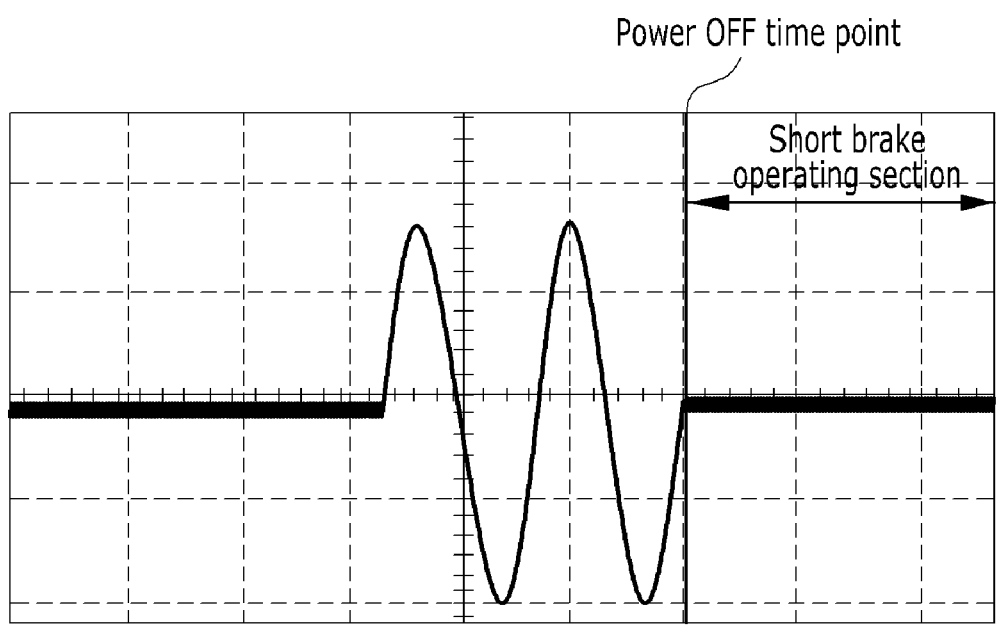
FIG. 5 is a waveform diagram showing a short brake section according to an embodiment of the present invention.

FIG. 4 is a waveform diagram showing a waveform of a vibrator according to an embodiment of the present invention, and FIG. 5 is a waveform diagram showing a short brake section according to an embodiment of the present invention.

Comparing the waveforms of the vibrators according to a conventional technique and an embodiment of the present invention with reference to FIGS. 3, 4 and 5, it may be confirmed that according to the present invention, a more vivid vibration feeling can be delivered to a user since the residual waveform of the vibration does not remain long and immediately disappears after the power is turned off according to short brake operation, and it may be, confirmed that there is an outstanding effect of receiving a response immediately.

On the other hand, the present invention may provide a linear vibration control method which can accurately and perfectly control residual vibration by reducing falling time by configuring a short circuit when the power applied to a circuit which generates vibration of a vibration generating device is turned off.

The linear vibration control method according to an, embodiment of the present invention may include: a power applying step of applying power to a circuit including a coil 11 by an external stimulus, a driving step of generating vibration as current flowing in the coil 11 by the power applying step reacts with a permanent magnet 31; a power shutdown step of shutting down the power as the external stimulus to the circuit including the coil 11 is stopped; and a short circuit configuration step of configuring a short circuit which short-circuits the circuit including the coil 11, of which the power is shut down by the power shutdown step.

In addition, the linear vibration control method may further include an open circuit maintaining step of maintaining an open circuit state of the circuit including the coil after control on linear vibration is finished by the short circuit configuration step.

In addition, the short circuit configuration step may include at least any one among a first control step of configuring the short circuit through a reed switching system, a second step of configuring the short circuit through configuration of a brake circuit including an H-bridge, and a third step of configuring the short circuit through configuration of a circuit including a MOSFET, and the linear vibration control method may further include a delay step between the power shutdown step and the short circuit configuration step.

According to the present invention, there is provided a linear vibration generating device which can promptly remove residual vibration by increasing the amount of vibration damping of the actuator after the vibration operation generating in association with a signal inputted by a user or a touch on a screen, by providing a system which configures a circuit constituting the linear vibration generating device as a short circuit right after the power applied to the circuit is turned off.

In addition, the linear vibration generating device can be easily manufactured since an additional space for preparing a structure as described above inside the linear vibration generating device is not required, and there is an outstanding effect of promptly removing residual vibration by increasing the amount of vibration damping after the vibration operation of the vibration generating device including a permanent magnet is finished.

The spirit of the present invention described above is illustrative purposes only, and those skilled in the art may make various changes and modifications without departing from the intrinsic characteristics of the present invention. Accordingly, the embodiments disclosed in the present invention are not to limit, but to explain the spirit of the present invention, and the scope of the present invention is not limited by these embodiments.

The protection scope of the present invention should be interpreted by the appended claims, and all technical spirits within a range the same as that of the present invention should be interpreted as being included in the scope of the present invention.

What is claimed is:

1. A linear vibration generating device comprising:
a bracket (10) to which a coil (11) is fixed;
a case (20) combined with the bracket (10);
a vibrator (30) including a permanent magnet (31) of a ring shape and provided inside the case; and
an elastic body combined with the vibrator (30),
wherein a response time is improved by using counter electromotive voltage that is generated after power of a circuit connected to the coil (11) is turned off,
wherein a short circuit (A) is configured after power of the circuit connected to the coil (11) is turned off in order to use the counter electromotive voltage.

2. The device according to claim 1, wherein the short circuit (A) is configured using a reed switching system.

3. The device according to claim 2, wherein whether there is a delay time before the short circuit (A) is configured after power of the circuit connected to the coil (11) is turned off is set by a user.

4. The device according to claim 3, wherein the delay time varies according to setting of the user.

5. The device according to claim 1, wherein the short circuit (A) is configured using a brake circuit including an H-bridge including a transistor pair.

6. The device according to claim 5, wherein whether there is a delay time before the short circuit (A) is configured after power of the circuit connected to the coil (11) is turned off is set by a user.

7. The device according to claim 6, wherein the delay time varies according to setting of the user.

8. The device according to claim 1, wherein the short circuit (A) is configured using a circuit including a MOSFET.

9. The device according to claim 8, wherein whether there is a delay time before the short circuit (A) is configured after power of the circuit connected to the coil (11) is turned off is set by a user.

10. The device according to claim 9, wherein the delay time varies according to setting of the user.

11. A linear vibration control method comprising:
a power applying step of applying power to a circuit including a coil (11);
a driving step of generating vibration as current flowing in the coil (11) by the power applying step reacts with a permanent magnet (31);
a power shutdown step of shutting down the power applied to the circuit including the coil (11); and
a short circuit configuration step of short-circuiting the circuit including the coil 11 after the power is shut down by the power shutdown step.

12. The method according to claim 11, further comprising an open circuit maintaining step of maintaining an open circuit state of the circuit including the coil after control on linear vibration is finished by the short circuit configuration step.

13. The method according to claim 12, wherein the short circuit configuration step includes at least one of a first control step of configuring the short circuit through a reed switching system, a second step of configuring the short circuit through configuration of a brake circuit including an H-bridge, and a third step of configuring the short circuit through configuration of a circuit including a MOSFET.

14. The method according to claim 12, further comprising a delay step between the power shutdown step and the short circuit configuration step.

* * * * *